(12) United States Patent
Sadowski et al.

(10) Patent No.: US 11,658,681 B2
(45) Date of Patent: *May 23, 2023

(54) ENERGY EFFICIENT ADAPTIVE DATA ENCODING METHOD AND CIRCUIT

(71) Applicant: ADVANCED MICRO DEVICES, INC., Santa Clara, CA (US)

(72) Inventors: Greg Sadowski, Boxborough, MA (US); John Kalamatianos, Boxborough, MA (US)

(73) Assignee: ADVANCED MICRO DEVICES, INC., Santa Clara, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 17/348,202

(22) Filed: Jun. 15, 2021

(65) Prior Publication Data

US 2021/0320672 A1     Oct. 14, 2021

Related U.S. Application Data

(63) Continuation of application No. 16/792,486, filed on Feb. 17, 2020, now Pat. No. 11,038,526, which is a
(Continued)

(51) Int. Cl.
  *H04B 1/16*  (2006.01)
  *H03M 7/30*  (2006.01)
  *H04B 1/04*  (2006.01)
  *H04B 3/54*  (2006.01)
  *H03M 5/04*  (2006.01)

(52) U.S. Cl.
  CPC ........... *H03M 7/6047* (2013.01); *H03M 5/04* (2013.01); *H04B 1/04* (2013.01); *H04B 1/16* (2013.01); *H04B 3/54* (2013.01)

(58) Field of Classification Search
  CPC ............ H03M 7/02; H03M 7/06; H03M 7/14; H03M 5/00; H03M 5/02; H03M 5/04; H03M 5/06; H03M 5/08; H03M 5/12; H03M 5/14; H03M 5/16; H04B 1/04;
(Continued)

(56) References Cited

U.S. PATENT DOCUMENTS 5,852,630 A   12/1998 Langberg et al.
7,694,264 B2 * 4/2010 Warren ................ H03K 5/135
                                                  716/130
(Continued)

OTHER PUBLICATIONS

NPL (DESC: Energy-Efficient Data Exchange using Synchronized Counters by Mahdi Nazm Bojnordi and Engin Ipek, published on Dec. 7, 2013) (Year: 2013).*

(Continued)

*Primary Examiner* — Siu M Lee

(57) ABSTRACT

Various energy efficient data encoding schemes and computing devices are disclosed. In one aspect, a method of transmitting data from a transmitter to a receiver connected by plural wires is provided. The method includes sending from the transmitter on at least one but not all of the wires a first wave form that has first and second signal transitions. The receiver receives the first waveform and measures a first duration between the first and second signal transitions using a locally generated clock signal not received from the transmitter. The first duration is indicative of a first particular data value.

20 Claims, 10 Drawing Sheets

Related U.S. Application Data continuation of application No. 15/683,231, filed on Aug. 22, 2017, now Pat. No. 10,566,996.

(58) Field of Classification Search
CPC . H04B 1/16; H04B 3/54; H04B 3/542; H04B 14/02; H04B 14/026; H04B 14/04
See application file for complete search history.

(56) References Cited

U.S. PATENT DOCUMENTS

| | | | |
|---|---|---|---|
| 8,964,879 B2* | 2/2015 | Navid | H04L 1/0002 375/259 |
| 10,566,996 B2* | 2/2020 | Sadowski | H03M 5/04 |
| 11,038,526 B2* | 6/2021 | Sadowski | H04B 1/16 |
| 2005/0078021 A1 | 4/2005 | Cohen et al. | |
| 2011/0156934 A1 | 6/2011 | Bae et al. | |
| 2012/0076232 A1 | 3/2012 | Schmidt | |
| 2012/0319751 A1* | 12/2012 | Tessarolo | H03K 5/133 327/160 |
| 2013/0342249 A1* | 12/2013 | Yang | H03L 7/0818 327/158 |
| 2016/0142071 A1 | 5/2016 | Hammerschmidt | |
| 2017/0139872 A1 | 5/2017 | Ladd et al. | |

OTHER PUBLICATIONS

Bojnordi et al., DESC: Energy-Efficient Data Exchange using Synchronized Counters, MICRO'46, Davis, CA, USA, dated Dec. 7-11, 2013, 13 pages.

* cited by examiner

ENERGY EFFICIENT ADAPTIVE DATA ENCODING METHOD AND CIRCUIT

This application is a continuation of Ser. No. 15/683,231, filed Aug. 22, 2017.

BACKGROUND OF THE INVENTION

Modern microprocessors consume dynamic power by performing computations and by moving data. The movement of data involves driving on-chip interconnects, which are typically relatively long wires combined with repeaters to linearize wire delay. Interconnect power consumption is also due to the capacitive effects of voltage transitions on neighboring wires. As processors scale upward in size, interconnect lengths trend upward as well.

Conventional techniques for transmitting data include parallel, serial and deterministic. In conventional parallel techniques, a given digital number is transmitted as a group of bits on plural wires in parallel. An N-bit number will use N physical wires, one wire for each bit. If all the wires hold zero values prior to transmission, the transmission of the N-bit number will require some number of voltage toggles, i.e., from low to high. These toggles, otherwise known as bit flips, consume power. In conventional serial techniques, the N-bit number is transmitted on a single wire, but one bit at a time in sequence. Serial is typically slower than parallel and still requires multiple toggles. In a conventional deterministic transmission technique known as Pulse Position Modulation (PPM) the power consumption for data movement is independent of the data value being transmitted. It purports to achieve deterministic per-wire toggling power because the amount of toggling is independent of the actual data values being transmitted. In one conventional variant, a digital number is divided into two N/2-bit chunks, and each chunk is sent by toggling one of two data wires. A reset wire is shared by all data wires to specify the start of the data transmission. Both the transmitter and the receiver of the data require clocking to enable synchronization.

BRIEF DESCRIPTION OF THE DRAWINGS

The foregoing and other advantages of the invention will become apparent upon reading the following detailed description and upon reference to the drawings in which.

DETAILED DESCRIPTION

Figure 1:
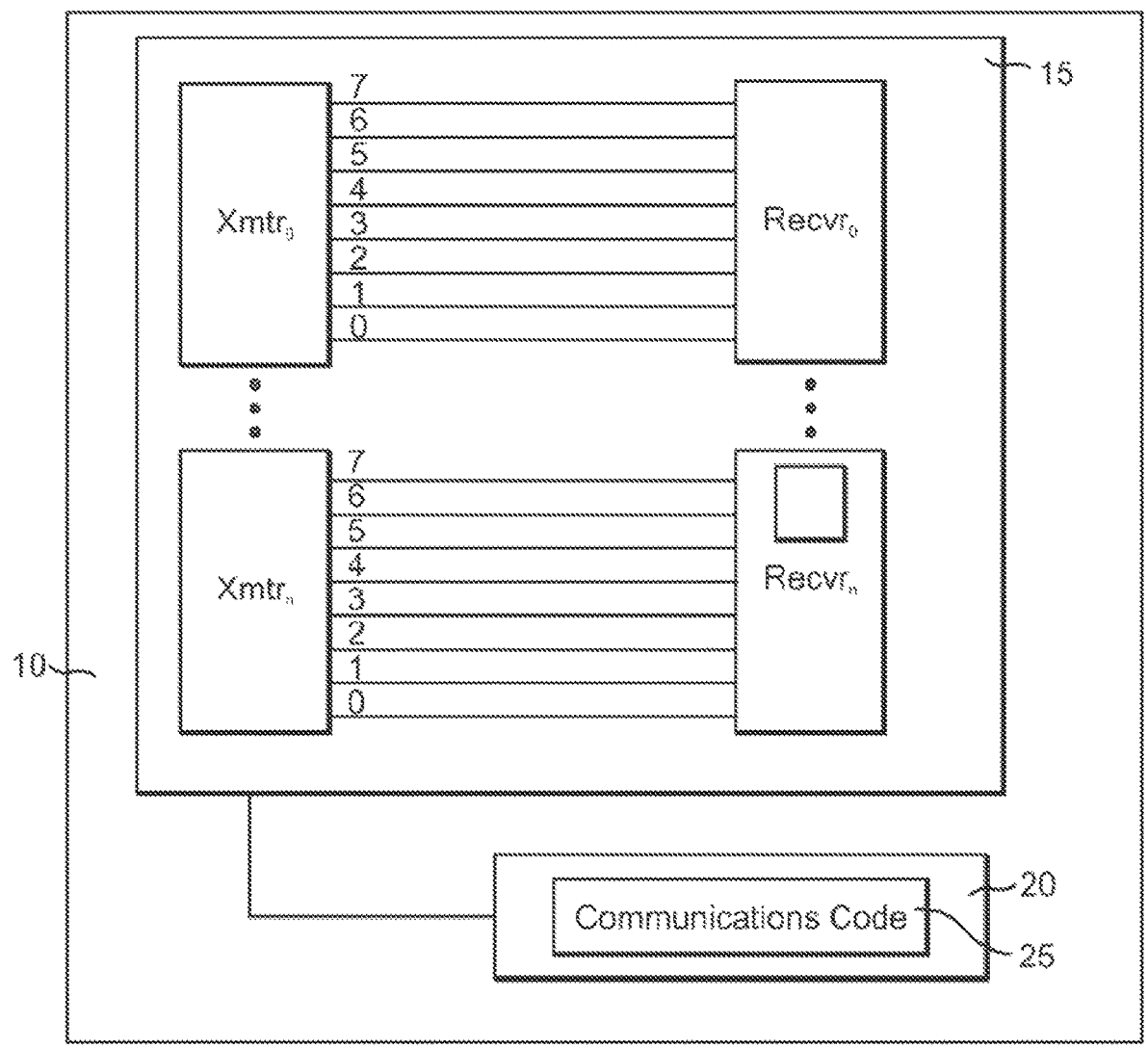
FIG. 1 is a block diagram of an exemplary computing device.

Interconnect driving power consumption grows with the lengths and numbers of interconnects. Conventional PPM suffers from a significant loss of bandwidth that varies based on the transmitted data values. Moreover, in conventional PPM both the transmitter and receiver need clocking support to synchronize, and this then requires clock signals to be distributed (via a required clock tree), so the transmitter and receiver run from the same clock. This clock distribution takes a significant slice of the overall power budget. The power consumed due to transitions across neighboring wires still varies because the transitions can be interleaved across time. Nevertheless, deterministic power consumption is desirable because it reduces di/dt noise and enables more accurate power budget definition. Also off-die interconnect data movement power does not scale well with technology.

There are scenarios where there is a need to minimize the power consumption of moving data even at the cost of performance (e.g. lower interconnect bandwidth). For example, during a "static screen display" state of a computer power needs to be minimized to prolong battery life under a minimum bandwidth requirement. A similar example, is BlueRay playback.

In accordance with one aspect of the present invention, a method of transmitting data from a transmitter to a receiver connected by plural wires is provided. The method includes sending from the transmitter on at least one but not all of the wires a first wave form that has first and second signal transitions. The receiver receives the first waveform and measures a first duration between the first and second signal transitions using a locally generated clock signal not received from the transmitter. The first duration is indicative of a first particular data value.

In accordance with another aspect of the present invention, a method of operating computing device is provided. The method includes selectively operating the computing device in an efficiency-based encoding mode. While operating in efficiency-based encoding mode, transmitting data from a transmitter to a receiver connected by plural wires by sending from the transmitter on at least one but not all of the wires a wave form that has first and second signal transitions. With the receiver receiving the waveform and measuring a duration between the first and second signal transitions using a locally generated clock signal not received from the transmitter. The duration is indicative of a particular data value.

In accordance with another aspect of the present invention, a computing device is provided that includes a receiver that has a circuit to generate a local clock signal and a transmitter connected to the receiver by plural wires. The transmitter is configured to send to the receiver on at least one but not all of the wires a first wave form having first and second signal transitions. The receiver is configured to receive the first waveform and measure a first duration between the first and second signal transitions using the locally generated clock signal not a clock signal from the transmitter. The first duration is indicative of a first particular data value.

In the drawings described below, reference numerals are generally repeated where identical elements appear in more than one figure. Turning now to the drawings, and in particular to FIG. 1 which is a block diagram of an exemplary computing device 10. The computing device 10 may be any of a huge variety of different electronic devices such as a notebook computer, a tablet computer, a smart phone, a general purpose computer, a game console, a digital television, a handheld mobile device, a server, a memory device, an add-in board such as a graphics card, or any other computing device employing intra-chip communications. The computing device 10 may include one or more components such as the semiconductor chip 15 and a storage device 20. The semiconductor chip 15 can be a microprocessor, a graphics processing unit, an accelerated processing unit that combines aspects of both or an application integrated specific circuit or other. The storage device 20 can be a non-volatile computer readable medium and can be any kind of hard disk, optical storage disk, solid state storage device, ROM, RAM or virtually any other system for storing computer readable media. The storage device 20 is operable to store non-transient computer readable instructions for performing various functions disclosed herein. Among other things, the storage device 20 can contain various types of programming code, one example of which is Communications Code 25 that facilitates the communications between various internal components of the semiconductor chip 15. The Communications Code 25 can perform or aid in performing the energy efficient encoding techniques described herein.

To facilitate intra-chip communications, the semiconductor chip 15 includes plural transmitters $Xmtr_0 \ldots Xmtr_n$ and plural receivers $Recvr_0 \ldots Recvr_n$. It should be understood that the number of transmitters $Xmtr_0 \ldots Xmtr_n$ and receivers $Recvr_0 \ldots Recvr_n$ can be quite numerous and indeed number into the thousands or more depending upon the complexity of the semiconductor chip 15. A given transmitter, such as transmitter $Xmtr_0$, is an arrangement of logic to transmit digital signals using discrete logic levels. A given receiver, such as receiver $Recvr_0$, is an arrangement of logic to receive digital signals using discrete logic levels. It should be understood that the transmitters $Xmtr_0 \ldots Xmtr_n$ can be physically or logically associated with various components of the semiconductor chip 15 and used wherever there is a requirement to transfer data from one location to another and vice versa. A given transmitter, such as transmitter $Xmtr_0$, is connected to a given receiver, such as receiver $Recvr_0$, by way of multiple wires. In this illustrated arrangement eight wires 0, 1, 2, 3, 4, 5, 6 and 7 are used. The wires 0, 1, 2, 3, 4, 5, 6 and 7 can be part of a bus or other type of interconnect structure. Of course, it should be understood that there may be less than or many more than eight wires. The transmitter $Xmtr_n$ may be similarly electronically connected to the receiver $Recvr_n$ by way of other wires 0, 1, 2, 3, 4, 5, 6 and 7 as shown. The skilled artisan will appreciate that the wires 0, 1, 2, 3, 4, 5, 6 and 7 can number more or less than eight, and each transmitter can drive signals on more than the eight wires 0, 1, 2, 3, 4, 5, 6 and 7.

Figure 2:
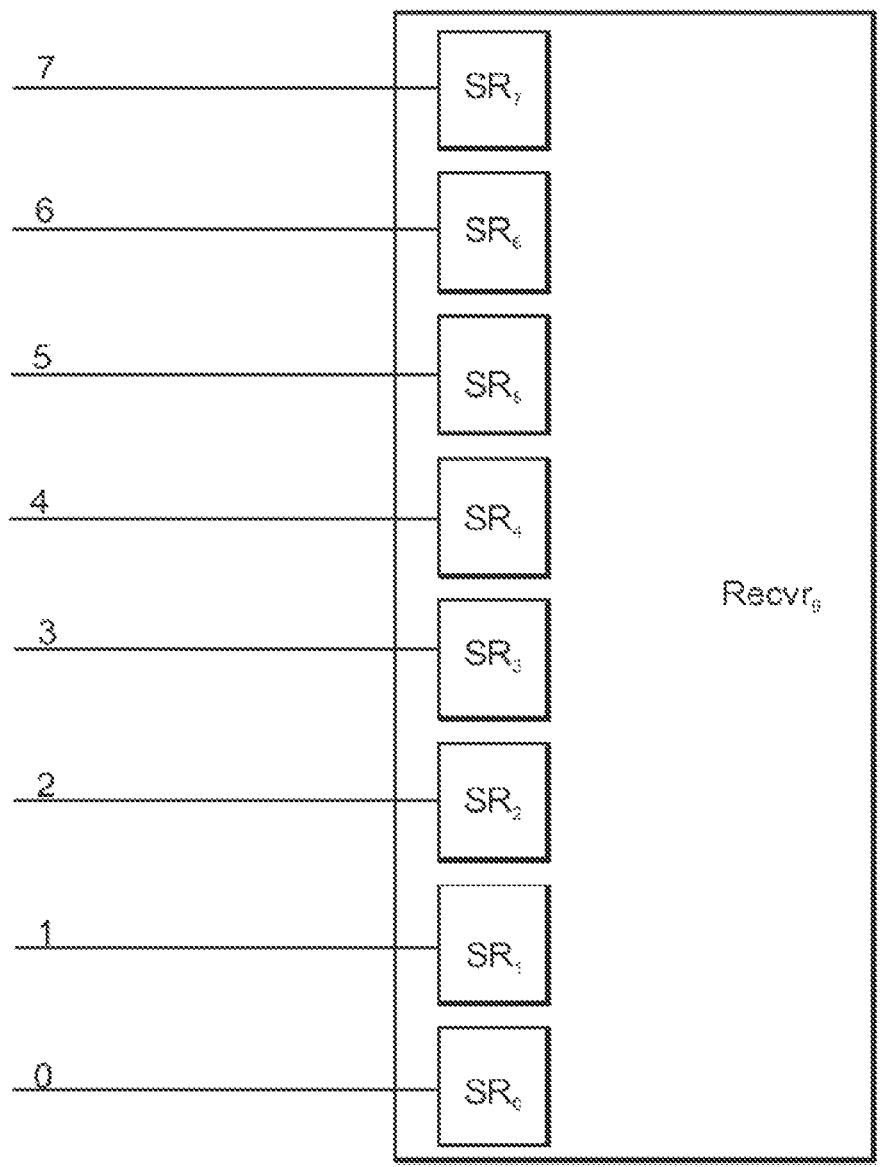
FIG. 2 is a block diagram of an exemplary chip receiver with serial receiver circuits.

Additional details of the receiver $Recvr_0$ will be described in conjunction with FIG. 2. The following description of the receiver $Recvr_0$ will be illustrative of the receivers $Recvr_0 \ldots Recvr_n$. The $Recvr_0$ includes plural serial receiver circuits, $SR_0$, $SR_1$, $SR_2$, $SR_3$, $SR_4$, $SR_5$, $SR_6$, and $SR_7$, one for each of the wires 0, 1, 2, 3, 4, 5, 6 and 7. The serial receiver circuits $SR_0$, $SR_1$, $SR_2$, $SR_3$, $SR_4$, $SR_5$, $SR_6$, and $SR_7$ are configured, among other things, to receive data transmissions that are deterministically encoded and, via self-clocking, translate those encoded data transmissions into digital numbers (or words). Additional details of exemplary circuitry for the serial receiver circuits $SR_0$, $SR_1$, $SR_2$, $SR_3$, $SR_4$, $SR_5$, $SR_6$, and $SR_7$ will be described below in conjunction with additional figures.

Figure 3:
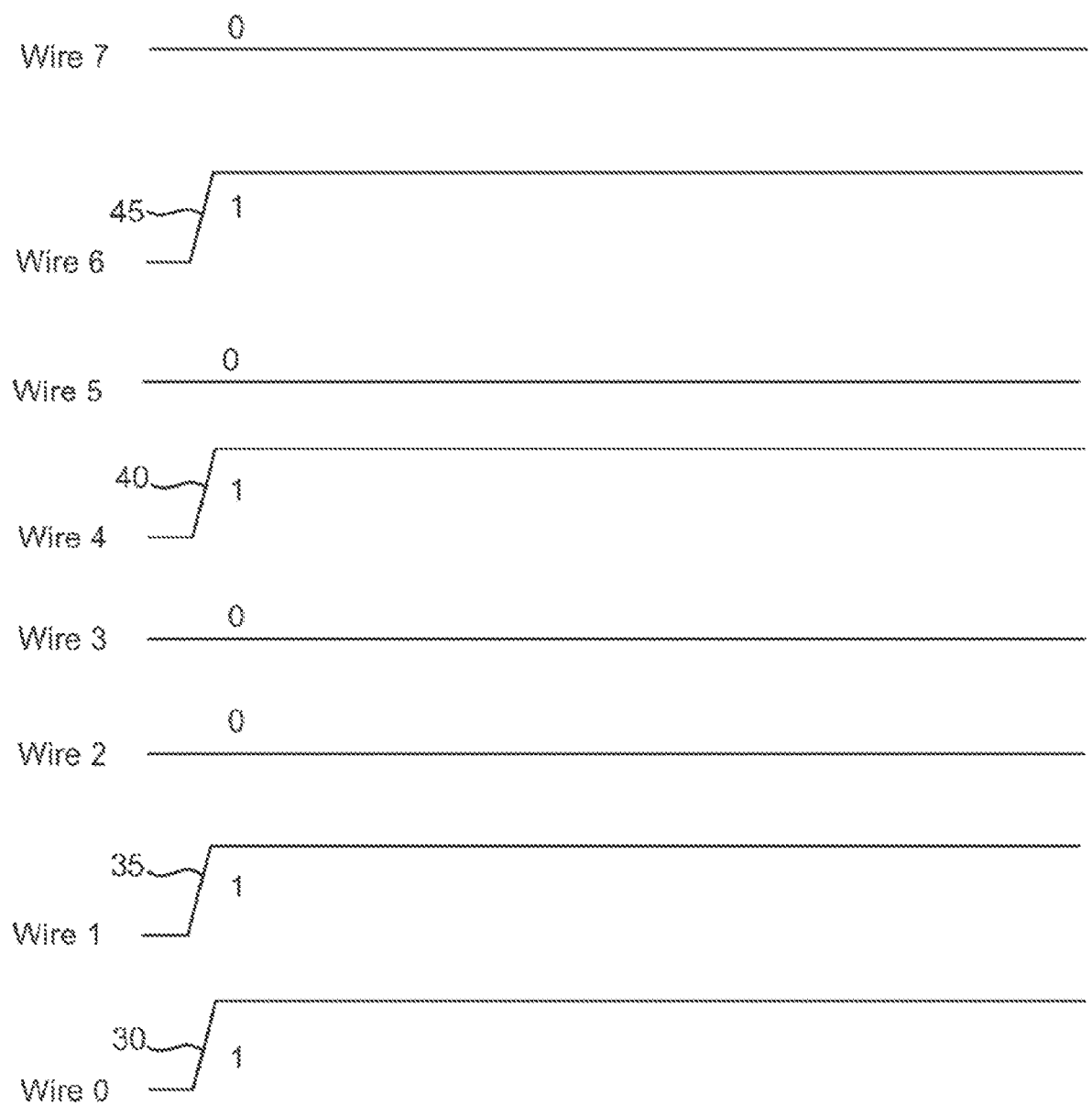
FIG. 3 is a timing diagram depicting a conventional parallel transmission technique.

Three conventional techniques for transmitting a number or other piece of digital information from one of the transmitters to one of the receivers will be illustrated and described now in conjunction with FIGS. 1, 3, 4 and 5. It is assumed for the purposes of this illustration that the transmitter $Xmtr_0$ will transmit the digital number 01010011 to the receiver $Recvr_0$ using one or more of the wires 0, 1, 2, 3, 4, 5, 6 and 7. As shown in FIG. 3, one conventional technique is simply to transmit the digital number 01010011 in parallel using all of the wires 0, 1, 2, 3, 4, 5, 6 and 7. As shown in FIG. 3, transmission of a logic 1 value, such as on lines 0, 1, 4 and 6, requires respective toggles 30, 35, 40 and 45 from a voltage low to a voltage high state while the transmission of logic 0 on lines 2, 3, 5 and 7 does not require toggles. Thus, to transmit the digital number 01010011 in parallel on the lines 0, 1, 2, 3, 4, 5, 6 and 7 will require a total of four toggles 30, 35, 40 and 45. As noted in the Background section hereof, each time a voltage toggle is executed, power is consumed.

Figure 4:
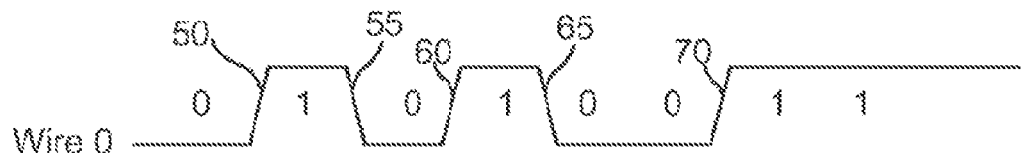
FIG. 4 is a timing diagram depicting a conventional serial transmission technique.

The transmission of the digital number 01010011 in serial fashion is depicted in FIG. 4. Here, any of the wires 0, 1, 2, 3, 4, 5, 6 and 7 could be used, but it is assumed that wire 0 is used. The serial transmission of the 8-bit number requires low to high or high to low toggles 50, 55, 60, 65 and 70 or a total of five toggles in order to transmit the digital number 01010011. One characteristic shared by the conventional parallel and serial data transmission techniques depicted in FIGS. 3 and 4 is that the number of toggles is proportional to the size of the word being transmitted. That is, greater bits require a greater number of toggles whether it is by parallel or serial transmission.

Figure 5:
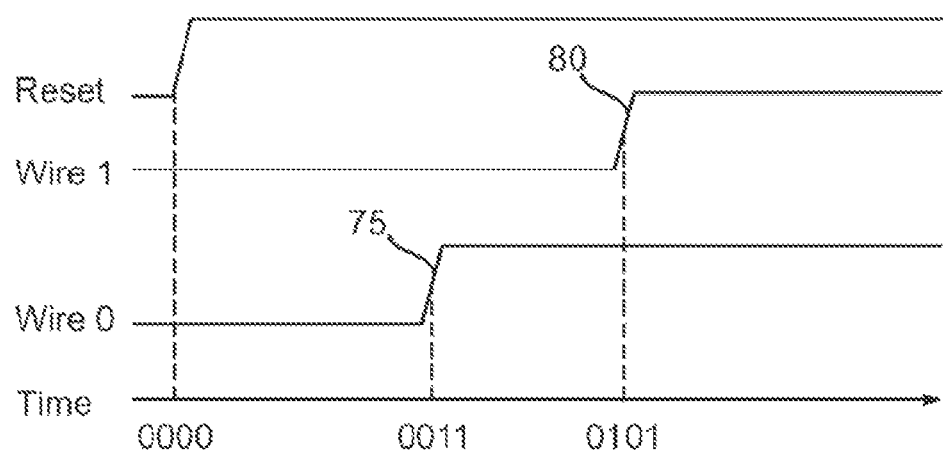
FIG. 5 is a timing diagram depicting a conventional PPM transmission technique.

Finally, a so-called deterministic data exchange technique known as PPM (described briefly in the Background section above) is depicted in FIG. 5. In this technique, information is represented by the delay between two consecutive pulses on a set of wires, which in theory, makes the number of state transitions or toggles on the wires independent of the data patterns. Here, the digital number 01010011 is transmitted on two wires, wire 0 and wire 1, sequentially as two chunks. Three wires, wire 0 and wire 1 for data, one for reset are needed. The data byte is divided into two four-bit chunks, and each chunk is sent by toggling one of the two data wires, wire 0 or wire 1. The reset wire is shared by all data wires wire 0 and wire 1 to specify the start of the data transmission. The number of clock cycles between the reset signal and a bit-flip on a data wire represents the value of the corresponding chunk. The transfer results in a total of three bit-flips across the reset and data wires wire 0 and wire 1. The receiver is synchronized with the transmitter through a synchronization strobe (not shown) sent from the transmitter, and there is some overhead associated with the synchronization strobe. In this example, there can be a reduction in interconnect energy by using fewer wires than parallel transmission, and by restricting the number of bit-flips to one per chunk. Note that in this conventional technique, transmitted numbers are partitioned into fixed-size, contiguous chunks, and each chunk is assigned to a specific wire; if the number of chunks is greater than the number of wires, multiple chunks are assigned to each wire, and are transmitted successively.

Figure 6:
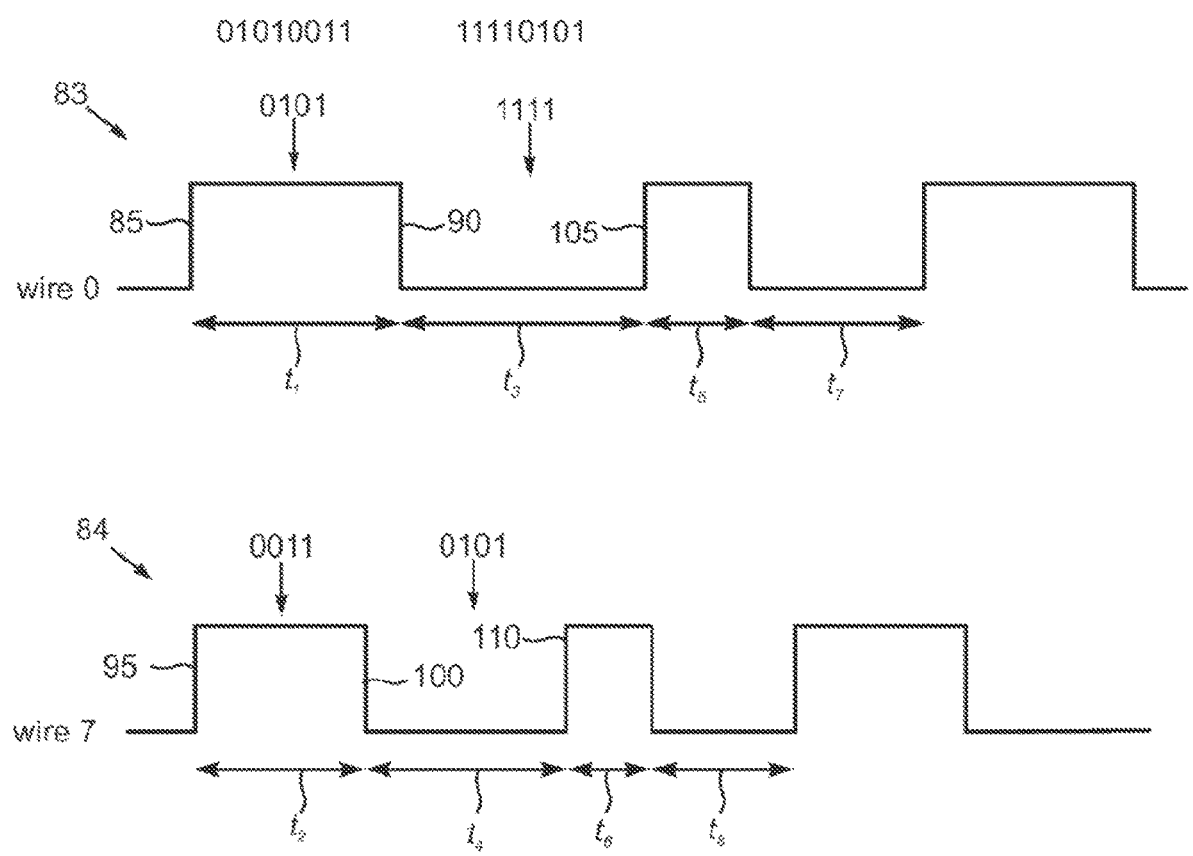
FIG. 6 is a timing diagram depicting exemplary modified PPM pulse trains.

An exemplary data communications technique for transmitting data between a transmitter and a receiver, such as transmitter $Xmtr_0$ and receiver $Recvr_0$ depicted in FIG. 1, will now be described in conjunction with both FIGS. 1, 2 and 6. The technique is deterministic but in a different way than the technique depicted in FIG. 5. Instead of sending the data in parallel on wide buses, the data is sent over a subset of the available wires. Thus for the digital number 01010011, which is an 8-bit number example, X-bits of data are sent on one physical wire, say wire 0 in FIG. 1 and Y-bits of data are sent on another, preferably non-neighboring wire, say wire 7, by modulating the duration between signal transitions. Here X and Y can be equal or different where X+Y=8 or whatever the bit-width is, e.g., 8-bit, 32-bit, 64-bit, etc. Assume for the purposes of this illustration that X=Y=4 and thus 4-bits of data (of the number 01010011) are sent on wire 0 and the other 4-bits of data are sent on the wire 7. Instead of using pulses, the encoding technique uses signal transitions (either up or down) to indicate when an old message ends transmission and a new message starts its transmission. For example, FIG. 6 depicts a couple of exemplary wave forms 83 and 84. The wave form 83 is transmitted on a given wire, say wire 0, by a transmitter, such as $Xmtr_0$, and received by a receiver, such as receiver $Recvr_0$ The other wave form train 84 is transmitted on another, preferable non-neighboring wire, say wire 7, by the transmitter $Xmtr_0$, and received by the receiver $Recvr_0$. The wave form 83 is sensed by the serial receiver circuit $SR_0$ and the wave form 84 is sensed by the serial receiver circuit $SR_7$. The rising edge 85 of the wave form 83 signifies the start of a digital number (or word) or portion thereof and falling edge 90 signifies the end of the digital number or portion thereof and also the start of the next digital word or portion on wire 0. So assuming for this example that the digital word 01010011 is divided into two 4-bit chunks 0101 and 0011, the rising edge 85 of the wave form 83 signifies the start of the 4-bit chunk 0101 and the falling edge 90 signifies the end of the 4-bit chunk 0101. The duration $t_1$ between the rising edge 85 and the falling edge 90 represents the chunk 0101. The serial receiver circuit $SR_0$ measures the duration $t_1$ and outputs a Received Number, which in this case is the chunk 0101, to the receiver $Recvr_0$. In parallel, the other chunk 0011 of the digital word is transmitted on wire 7. Thus, the rising edge 95 of the wave form 84 signifies the start of the 4-bit chunk 0011 and the falling edge 100 signifies the end of the 4-bit chunk 0011. The duration $t_2$ between the rising edge 95 and the falling edge 100 represents the chunk 0101. The serial receiver circuit $SR_7$ measures the duration $t_2$ and outputs another Received Number, which in this case is the chunk 0011, to the receiver $Recvr_0$. The receiver $Recvr_0$ then combines the chunks 0101 and 0011 into the received word 01010011.

Now assume that a subsequent digital word, say 11110101, is transmitted on wires 0 and 7 as two 4-bit chunks 1111 and 0101. Thus, the duration $t_3$ between the falling edge 90 and the next rising edge 105 of the wave form 83 represents the chunk 1111 and the duration $t_4$ between the falling edge 100 and the next rising edge 110 of the wave form 84 represents the chunk 0101. The duration $t_2$ between the rising edge 95 and the falling edge 100 represents the chunk 0101. The serial receiver circuit $SR_0$ measures the duration 1, and outputs a Received Number, which in this case is the chunk 1111, to the receiver $Recvr_0$. The serial receiver circuit $SR_7$ measures the duration $t_4$ and outputs another Received Number, which in this case is the chunk 0101, to the receiver $Recvr_0$. The receiver $Recvr_0$ then combines the chunks 1111 and 0010 into the received word 11110101. The next transmitted word is the combination of durations $t_5$ and $t_6$, and the next the combination of durations $t_7$ and $t_8$ and so on. In this way, there will be only one signal transition per 4-bit number and the power consumption of transmission is lower than that of conventional PPM. This new technique remains independent of the data value transmitted because the toggling per wire stays fixed to one transition. Power consumption between neighboring wires is also independent of the actual data value transmitted because the wires selected for the data transmission, wires 0 and 7, are selected so that they are not neighbors in the actual physical interconnect layout. This is possible because with the disclosed modified PPM only a subset of the physical wires for transmission (e.g. in a N-bit bus with 4-bit encoded values, we use only N/4 wires, the remaining wires remain idle and at a fixed state). So for the 8-bit bus of wires 0 . . . 7 depicted in FIG. 1, with 4-bit encoded values, only two wires, say wires 0 and 7, would be used while wires 1 . . . 6 remain idle. Thus, the transitions between neighboring wires is fixed and thus the inter-wire power consumption remains constant for every data transmission.

While the disclosed modified PPM algorithm can be used on a full time basis, another scenario provides for using the technique only in cases where bandwidth requirements are low and fixed (such as when the semiconductor chip 15 is in static screen mode or during BlueRay DVD playback for example). Note that an upper bound in the bandwidth loss can be established by the number of logical wires mapped to the same physical wire. For example, if 2-bits are mapped to the same wire, say wire 0, the max bandwidth will be 25% of the original. If 3-bits are allowed to be mapped on the same wire the max bandwidth will be 12.5% of the original. The final choice depends on the specific bus/interconnect where the modified PPM will be employed. As noted elsewhere herein, conventional PPM requires clock signals to be distributed (via clock tree), such that the transmitter and receiver have to run from the same clock. This clock absorbs a large slice of the available power budget. As described in more detail below, the disclosed new techniques and circuitry eliminates the clock signal flowing from transmitter to receiver entirely. Instead we will measure time intervals between signal transitions on the receiver side. Elimination of the clock propagation on longer interconnects is a major power saving feature in the disclosed arrangements.

Figure 7:
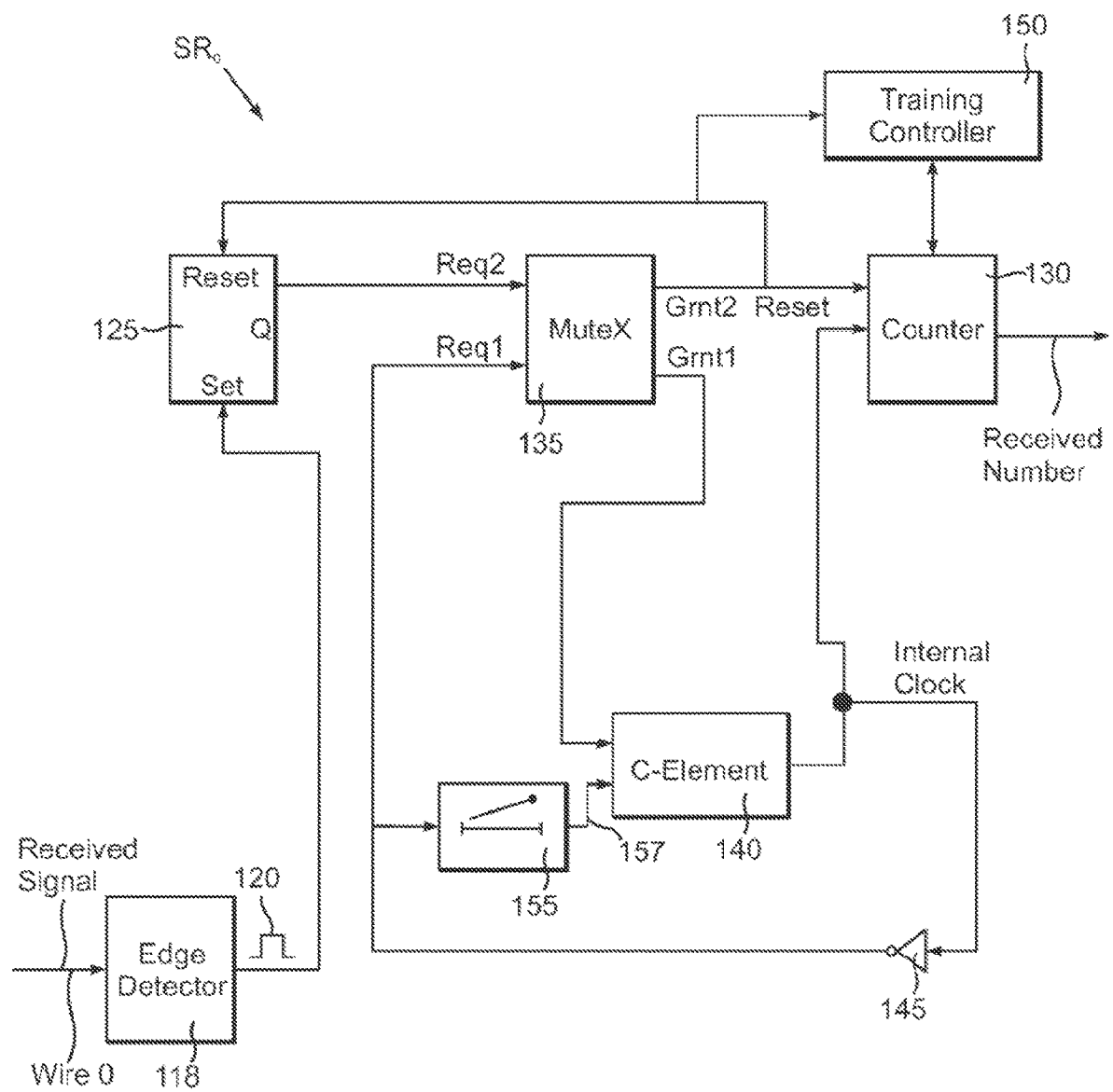
FIG. 7 is a block diagram of an exemplary serial receiver circuit.

Additional details of exemplary circuitry for the serial receiver circuits $SR_0$, $SR_1$, $SR_2$, $SR_3$, $SR_4$, $SR_5$, $SR_6$, and $SR_7$ will now be described in conjunction with FIG. 7, which is a block diagram of the serial receiver circuit $SR_0$. The following description of the serial receiver circuit $SR_0$ will be illustrative of the other serial receiver circuits $SR_1$, $SR_2$, $SR_3$, $SR_4$, $SR_5$, $SR_6$, and $SR_7$. As described in more detail below, the serial receiver circuit SR is configured to time the durations between receiver input signal toggles and output numbers based on the timed durations. The serial receiver circuit $SR_0$ takes in a Received Signal from one of the transmitters, say $Xmtr_0$, and delivers a Received Number output, which is the digital number value associated with the Received Signal. An example of the Received Signal is the wave form 83 depicted in FIG. 6. The Received Signal is delivered to an edge detector 118, which is designed to sense the rising and falling edges of the input signal, such as the rising and falling edges 85, 90 and 105 of the wave form 83 depicted in FIG. 6. Thus, upon sensing the rising edge 85 shown in FIG. 6, the edge detector 118 generates and delivers a square wave pulse 120 to a Set input of a Set/Reset circuit 125, which may be a latch, flip flop or some other type of logic element that is able to receive a Set input and a Reset input and store a value Q. The serial receiver circuit SR includes a counter 130 which is operable to count a number of clock cycles between edge transitions 85 and 90 and 90, 95 etc. and deliver a Received Number value based on the measured number of clock cycles. The Received Number is whatever the duration between the rising and the falling edges 80, 85, 90, etc., represents as digital data. The mapping of durations to digital values will be described below. A mutual exclusion circuit (MuteX) 135 is connected to the output of the Set/Reset circuit 125 and includes inputs Req2 and Req1 and outputs Grnt2 and Grnt1. The terms "Req" and "Grnt" are shorthand for Request and Grant, respectively. Input Req2 is the output Q of the Set/Reset circuit 125. Input Req1 is the inverted Internal Clock signal output from a C-Element 140 where the signal inversion is provided by way of an inverter 145. MuteX 135 arbitrates between the inputs Req1 and Req2 and, when asserted, selectively delivers those inputs as outputs Grnt2 and Grnt1, respectively. The Grnt2 output of MuteX 135 is: (1) delivered as a Reset signal to the counter 130; (2) fed back to the reset input of the set reset circuit 125; and (3) delivered as a Reset input to a training controller 150. The Grnt1 output of MuteX 135 is delivered as an input to the C-Element 140. In addition, the C-Element 140 receives as an input the inverted Internal Clock signal that is first passed through a variable delay line 155 whose delay can be programmed to meet certain requirements. The C-Element 140 has two inputs, Grnt1 and the output 157 of the delay line 155 and one output, Internal Clock, which is a locally generated clock signal and as noted above is fed back through the inverter 145 and also fed to the Counter 130. If the inputs, Grnt1 and the output 157 of the delay line 155 are the same logic level then the output Internal Clock of the C-Element 140 follows those inputs Grnt1 and 157. If, however, the inputs Grnt1 and the output of delay line 155 are not the same, then the Internal Clock output will change until the inputs Grnt1 and 157 are again the same. In this way, the C-Element 140 functions as an internal clock at the receiver side to provide a measurable number of clock cycles for the counter 130 to measure between two given Reset inputs from MuteX 135. The purpose of the delay line 155 is to determine the frequency $f_{clock}$ of the internal Clock output. The frequency $f_{clock}$ is given by:

$$f_{clock} = \frac{1}{(2*\text{Delay})} \quad (1)$$

where Delay is the delay value programmed into the variable delay line 155. In general it is desired that Delay be selected and programmed into the variable delay line 155 so that the clock period $P_{clock}$ given by:

$$P_{clock} = \frac{1}{f_{clock}} \quad (2)$$

is much shorter than the narrowest utilized time interval between the transmitted signal edges. For example, assume that duration $t_6$ in the example wave form 84 in FIG. 6 is the shortest utilized time interval for signal transmission. Therefore, Delay is selected so that:

$$P_{clock} \ll t_6 \quad (3)$$

MuteX 135 operates in conjunction with the C-Element 140 to ensure that signal Grnt2, and thus the Reset input to the counter 130, does not coincide in time with a rising edge of the Internal Clock signal from the C-element 140. This is desirable to avoid the types of instabilities that can happen when decisions or measurements by the counter 130 coincide with a rising clock signal.

Without prior knowledge of the encoding scheme used by the transmitters $Xmtr_0 \ldots Xmtr_n$, the counter 13 will not know what numbers are represented by the time durations $t_1$, $t_3$, $t_5$, etc., of the wave form 83 (and the same is true of the other serial receiver circuit $SR_7$). Accordingly, the serial receiver circuit $SR_0$ can operate in either training mode or operational mode. In training mode, a sequence of numbers is delivered as a wave form (like the wave form 83) as the Received Signal but along with known corresponding digital values. An example could be simply the transmission of consecutive numbers 0 to 15 while the remainder of the circuitry including the counter 130 measure the clock durations for the transmitted wave form, such as the wave form 83 shown in FIG. 6. For example, upon system initialization, the following lookup table in the training controller 150 or elsewhere can be populated as follows:

TABLE 1

| Integer Value | Binary Value | Duration $t_n$ (nanoseconds) |
|---|---|---|
| 0 | 0000 | 0.5 |
| 1 | 0001 | 1 |
| 2 | 0010 | 2 |
| 3 | 0011 | 3 |
| 4 | 0100 | 4 |
| 5 | 0101 | 5 |
| . | . | . |
| . | . | . |
| 14 | 1110 | 14 |
| 15 | 1111 | 15 |

So a transmitter $Xmtr_0$ sends known integer and/or binary value 1 and 0001 and a corresponding wave form with duration $t_n$ between rising and failing edges durations of 1 ns, and so on for the next succeeding numbers to 15 and 1111 This is a simple mapping scheme using 1 ns increments for each succeeding integer. However, virtually any mapping scheme could be used. For example, TABLE 2 below shows another possible mapping scheme where the mapping values for numbers 6-13 are omitted but could be various values.

TABLE 2

| Integer Value | Binary Value | Duration $t_n$ (nanoseconds) |
|---|---|---|
| 0 | 0000 | 0.5 |
| 1 | 0001 | 5 |
| 2 | 0010 | 4 |
| 3 | 0011 | 3 |
| 4 | 0100 | 2 |
| 5 | 0101 | 1 |
| . | . | . |
| . | . | . |
| 14 | 1110 | 10 |
| 15 | 1111 | 11 |

Figure 8:
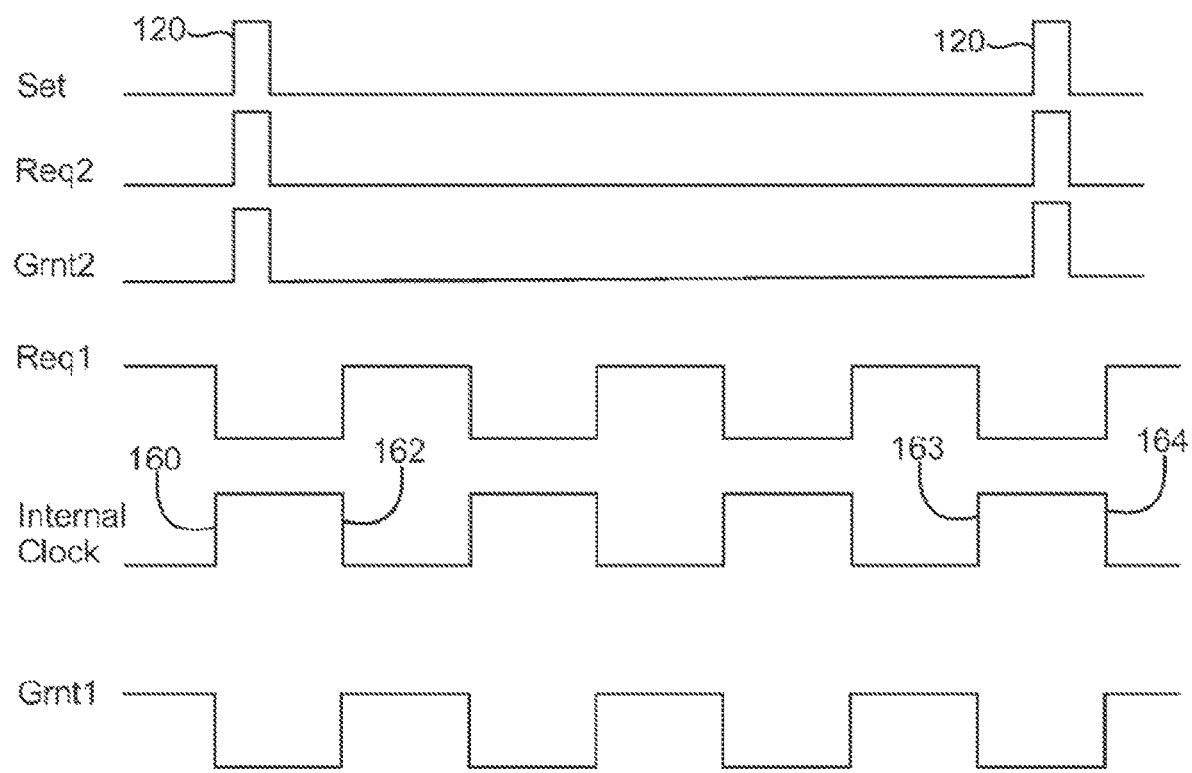
FIG. 8 is a timing diagram depicting one exemplary flow of signals through the serial receiver circuit of FIG. 7.

Inputs, outputs and switching for training mode will now be described in conjunction with FIGS. 6, 7 and 8. Assume that the wave form 83 (or something like it) is delivered as the Received Signal to the edge detector 118. When the edge detector 118 detects the rising edge 85, it generates a square wave pulse 120 at the Set input as shown in FIG. 7. The set reset circuit 125 delivers the pulse at the Req2 input to MuteX 135. Because Req2 is asserted while the Internal Clock signal is high (i.e., after Internal Clock rising edge 160 and before Internal Clock falling edge 162), MuteX 135 immediately grants or delivers the Req2 pulse as the Grnt2 output, which is delivered as the Reset signal to both the counter 130 and the training controller 150 and back to the Reset input of the set reset circuit 125. When the counter 130 receives the Reset input, it counts the number of clock cycles until the next edge (falling edge 90)) of the wave form 83 causes the edge detector 118 to generate another square wave pulse 120 at the Set input of the Set/Reset circuit 125, which, in-turn set signal is received and produces the next Reset input. Note that the signal Grnt1 simply cycles low to high and high to low, etc. tracking Req1 and opposite to the Internal Clock trace. Next, when the falling edge 90 is detected by the edge detector 118, the cycle repeats and since the set Req2 pulses are again received while the Internal Clock signal is high (i.e., after Internal Clock rising edge 163 and before Internal Clock falling edge 164), Grnt2 output is granted immediately and the Reset signal is sent to the counter 130, the training controller 150 and back to the Set/Reset circuit 125, which instructs the counter 130 to cease counting the number of clock cycles for duration $t_1$ and start a new count of clock cycles for duration $t_2$. The counter 130 then outputs the Received Number that is based on the number of clock cycles during time $t_1$ and corresponds to the known digital value that the training controller 150 has delivered to the counter 130 that corresponds to the time period $t_1$ between rising edge 85 and falling edge 90. This process is repeated for the remainder of the training transmissions and these subsequent transmissions will function as depicted in FIG. 7 so long as Req2 is asserted during an Internal Clock high period. During training mode, the training controller 150 populates its lookup table with the known digital values and measured clock cycles. This lookup table is thereafter used by the counter 130 to output Received Numbers during operational mode. Training mode can occur at many instances, such as device start up or otherwise periodically and need not use the same known digital values or training mode pulse durations. In an alternate arrangement, the lookup table is hardwired into the computing device 10 and/or the semiconductor chip shown in FIG. 1. Once training is complete, training mode is exited and operational mode can be entered. The serial receiver circuit $SR_0$ functions in operational mode much like in training mode adjust described. However, actual data is transferred to the serial receiver circuit $SR_0$ and processed using the encoding training imposed during training mode.

Figure 9:
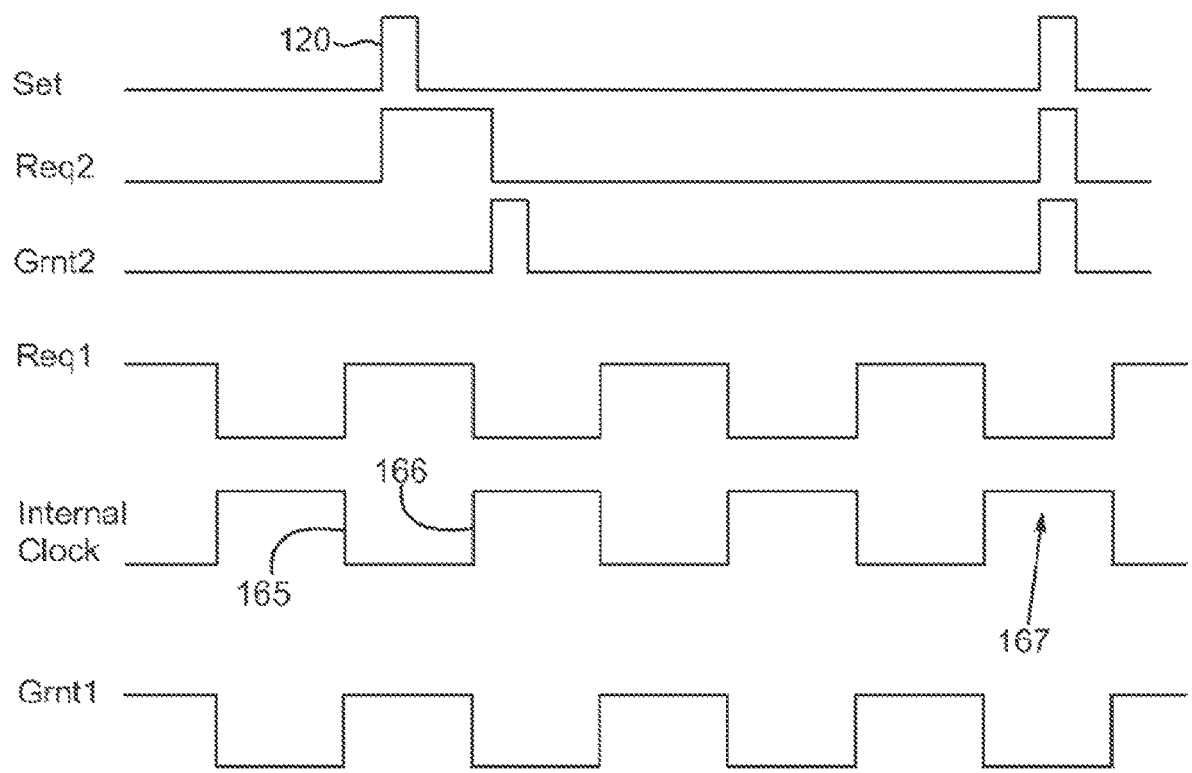
FIG. 9 is a timing diagram depicting another exemplary flow of signals through the serial receiver circuit of FIG. 7.

There can be circumstances during training mode or operational mode where Req2 may be asserted during an Internal Clock low period. The timing associated with this circumstance is depicted in FIG. 9 and will be explained also in conjunction with FIGS. 6 and 7. In FIG. 9, it is assumed that the Received Signal includes a rising or falling edge, say the rising edge 95 from FIG. 6, and thus the edge detector 118 delivers a pulse 120 to the Set input of the Set/Reset circuit 125. The Set/Reset circuit 125 in-turn delivers the pulse 120 as the Req2 input to MuteX 135. However, since Req2 is asserted while Internal Clock is low (i.e., between Internal Clock falling edge 165 and Internal Clock rising edge 166), there is a risk that the Req2 would be granted as Grnt2 at the same time that rising edge 166 of Internal Clock is delivered to the counter 130. This is a situation to be avoided if possible. Therefore, Grnt2 is delayed by MuteX 135 in time until after the next rising edge 166 of Internal Clock is encountered. MuteX 135 accomplishes this by arbitrating between Req2 and Req1. Thus, when the rising edge 166 of Internal Clock occurs, Req1 almost immediately thereafter swings low and MuteX 135 is then able to grant Req2 as Grnt2 and thus send the Reset input to the counter 130 so that the counter 130 can begin counting the number of clock cycles until the next Reset is received. The next Reset is received when the falling edge 100 of the wave form is detected by the edge detector 118 and thus the cycle repeats with the next square wave pulse 120 at the Set input. In this example, it is assumed that the Set and Req2 signals are delivered during an internal clock high phase 167 and thus Grnt2 is granted immediately and Reset is sent to the counter 130 immediately.

Figure 10:
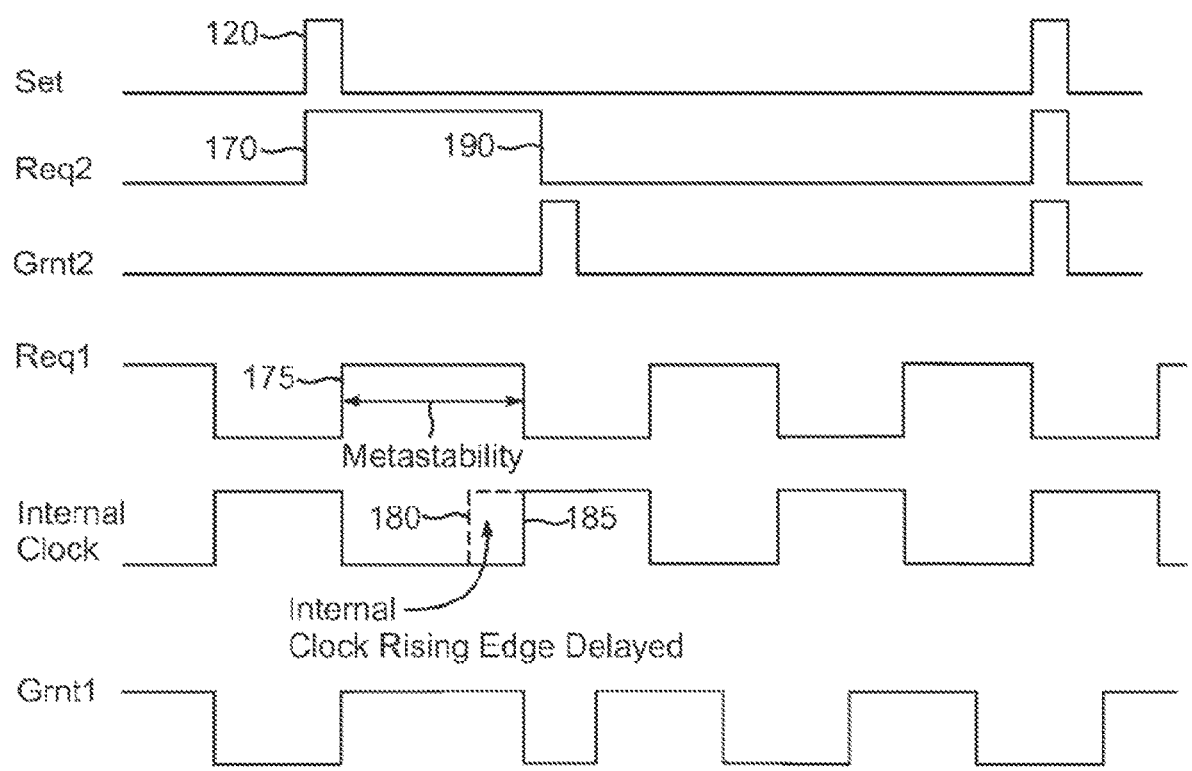
FIG. 10 is a timing diagram depicting another exemplary flow of signals through the serial receiver circuit of FIG. 7.

In rare circumstances, the MuteX circuit 135 can enter a metastable state when both Req1 and Req2 are asserted at the same time. During this metastable state, MuteX 135 will not arbitrate between Req1 and Req2 and the rising edge of Internal Clock will be delayed. The timing associated with this circumstance is depicted in FIG. 10 and will be explained also in conjunction with FIGS. 6 and 7. Here it is assumed that some rising or falling edge from for example the trace 83 in FIG. 6 is picked up by the edge detector 118 and the edge detector delivers the pulse 120 to the Set input. At that moment, Req2 is asserted high (rising edge 170) at MuteX 135. However, before MuteX 135 is able to swing Req2 low, Req1 is asserted (rising edge 175) and produces a period of metastability. During this time, MuteX 135 is unable to arbitrate between Req1 and Req2, thus Req2 remains high for some period of time after the rising edge 170 and Grnt2 remains low. Ordinarily, Internal Clock would rise again at point 180. However, in this circumstance MuteX 135 will remain in a metastable state for some period of time whose value is somewhat indeterminate. In any event, during the period of metastability, Internal Clock will be prevented from rising until point 185 when Grnt2 swings low and the C-Element 140 can again swing Internal Clock high. At this point, Req2 can swing low (falling edge 190) and Grnt2 is finally output and delivered as the Reset input to the counter 130 and to the Set/Reset circuit 125.

Figure 11:
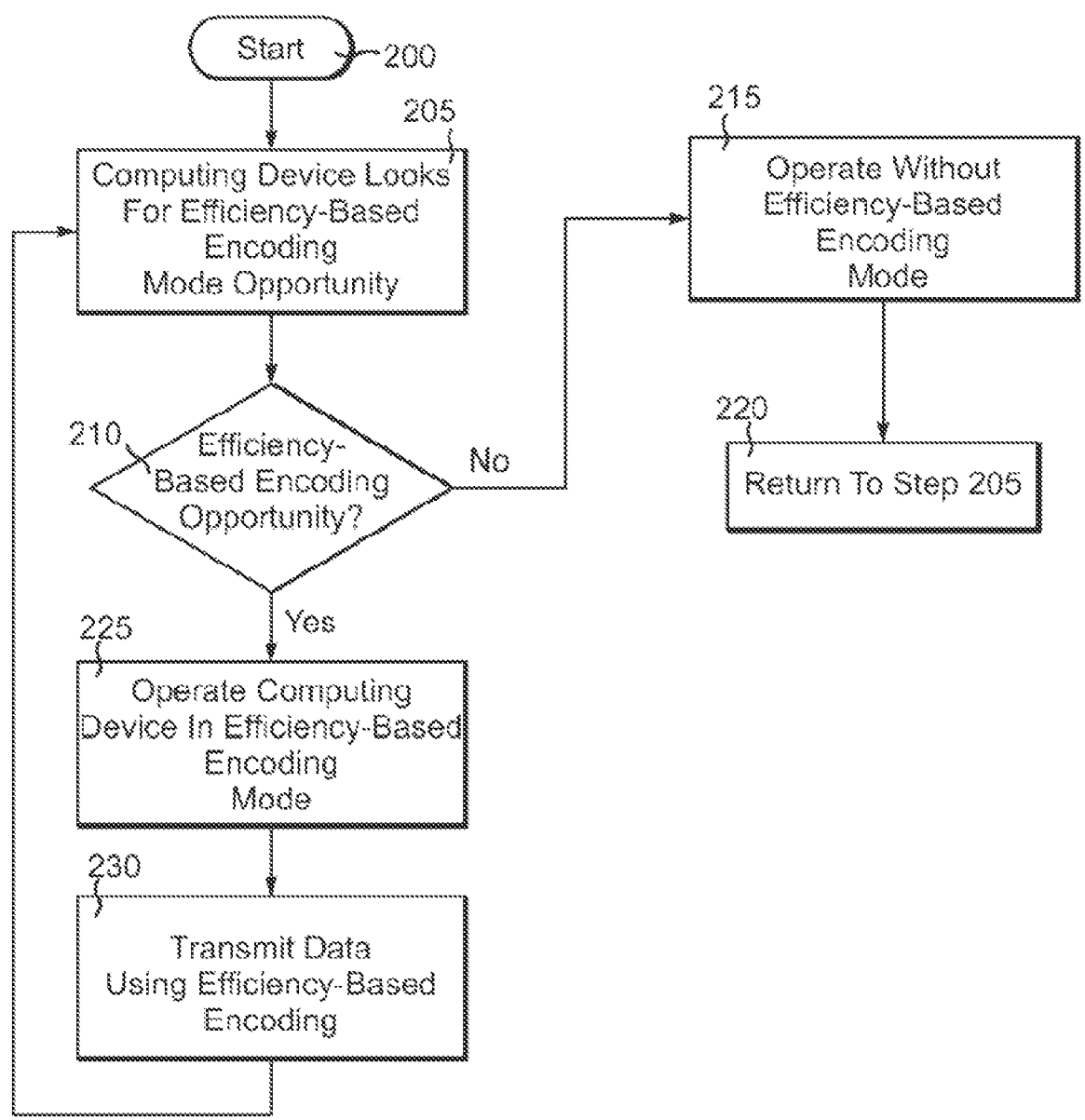
FIG. 11 is a flow chart depicting exemplary operation of the computing device with or without efficiency-based encoding mode.

An exemplary process flow for operation of the computing device 11 may be understood by referring now to FIG. 1 and to the flow chart depicted in FIG. 11. The operation of the computing device 10 utilizing the efficiency data encoding schemes disclosed herein may be termed efficiency-based encoding mode. It should be understood that the operation of the processor 15 in efficiency-based encoding mode is optional. Thus, after start at step 200, the computing device 10 may look for an efficiency-based encoding mode opportunity at step 205. This decision making can be governed by the communications code 25, operating system software, a driver, an application, firmware, combinations of these or the like. For example, the processor 15 might sense a static screen display, operation on battery power, or other circumstances where bandwidth reduction can be tolerated in exchange for reduced power consumption. Furthermore, the decision to whether or not to enter into efficiency-based encoding mode can be based on a manual selection by a user if that opportunity is presented by the computing device 10. Step 205 is repeatedly revisited, either on a periodic basis or where operating conditions change, say when a static screen display is no longer static. At step 210, if an opportunity for efficiency-based encoding mode is not seen, the process proceeds to step 215 and data encoding is performed in a mode other than efficiency-based and at step 220, the process then returns to step 205. If, on the other hand at step 210, an opportunity for efficiency-based encoding mode is detected, then at step 225 the processor 15 operates in efficiency-based encoding mode and step 230 transmits data using efficiency-based encoding mode described elsewhere herein in conjunction. Step 230 can return to step 205 periodically or when conditions change. The training mode described above can be swapped into steps 225 and 230.

While the invention may be susceptible to various modifications and alternative forms, specific embodiments have been shown by way of example in the drawings and have been described in detail herein. However, it should be understood that the invention is not intended to be limited to the particular forms disclosed. Rather, the invention is to coverall modifications, equivalents and alternatives falling within the spirit and scope of the invention as defined by the following appended claims.

What is claimed is:

1. A semiconductor chip, comprising:
a transmitter connected to a receiver by plural wires,
wherein the transmitter is configured to send to the receiver on at least one but not all of the wires a first wave form having first and second consecutive signal transitions with a first duration between the first and second signal transitions, wherein the first duration represents a first particular multi-bit data value;
wherein the transmitter is further configured to send to the receiver on at least one other of the wires a second wave form having first and second consecutive signal transitions with a second duration between the first and second consecutive signal transitions of the second wave form, wherein the second duration represents a second particular data value; and
wherein the first particular multi-bit data value is representative of a first portion of a combined data value and the second particular data value is representative of a second portion of the combined data value, and wherein the second portion follows the first portion.

2. The semiconductor chip of claim 1, wherein the semiconductor chip comprises a microprocessor, a graphics processing unit, or an accelerated processing unit.

3. The semiconductor chip of claim 1, wherein the receiver comprises a circuit to generate a local clock signal and is configured to measure the first duration using the local clock signal, wherein the local clock signal includes a series of high and low states, the receiver being configured to delay commencement of measurement of the first duration while the local clock signal is in a low state.

4. The semiconductor chip of claim 3, wherein the receiver includes an edge detector and a counter, the edge detector being configured to detect the first signal transition and in response thereto generate a pulse, and the counter being configured to receive the pulse and commence counting clock cycles upon receipt of the pulse, and the edge detector being configured to detect the second signal transition and in response thereto generate another pulse, the counter being configured to receive the another pulse and cease counting clock cycles upon receipt of the another pulse.

5. The semiconductor chip of claim 4, wherein the counter is configured to generate a received value based on the counted clock cycles.

6. The semiconductor chip of claim 1, wherein the receiver includes a mapping of a known data value to the first duration between the first and second consecutive signal transitions.

7. The semiconductor chip of claim 1, wherein the receiver is configured to combine the first particular multi-bit data value and the second particular data value into the combined data value.

8. A semiconductor chip, comprising:
a receiver including plural serial receiver circuits, each of the serial receiver circuits having a circuit to generate a local clock signal; and
a transmitter connected to the serial receiver circuits by plural wires,
wherein the receiver is configured to receive a first wave form and measure a first duration between first and second consecutive signal transitions using at least one of the local clock signals, wherein the first duration represents a first particular multi-bit data value.

9. The semiconductor chip of claim 8, where each of the serial receiver circuits comprises a counter to count clock cycles of the local clock signal and generate a received value based on the counted clock cycles, and a training controller connected to the counter and operable in a training mode and an operational mode, the training controller being operable, while in the training mode, to receive a sequence of numbers and a sequence of wave forms wherein each of the wave forms has a duration between rising and falling edges corresponding to one of the numbers, and to store the numbers and the corresponding durations in a look up table for use by the counter during the operational mode.

10. The semiconductor chip of claim 9, wherein the circuit to generate a local clock signal comprises a C-element having an output connected to the counter, a first input connected to the output, and a second input, the C-element being operable to output a first logic level if the first input and the second input are both at the first logic level or to output a second logic level if the first input and the second input are not both at the first logic level in order to bring the first input and the second input both to the first logic level.

11. The semiconductor chip of claim 10, wherein the first input comprises an inverter and a programmable delay line.

12. The semiconductor chip of claim 8, wherein the local clock signal includes a series of high and low states, each of the serial receiver circuits being configured to delay commencement of measurement of the first duration while the local clock signal is in a low state.

13. The semiconductor chip of claim 8, wherein each of the serial receiver circuits comprises an edge detector and a counter to count clock cycles of the local clock signal and generate a received value based on the counted clock cycles, the edge detector being configured to detect the first signal transition and in response thereto generate a pulse, and the counter being configured to receive the pulse and commence counting clock cycles upon receipt of the pulse, and the edge detector being configured to detect the second signal transition and in response thereto generate another pulse, the counter being configured to receive the another pulse and cease counting clock cycles upon receipt of the another pulse.

14. The semiconductor chip of claim 8, wherein each of the serial receiver circuits includes a mapping of a known data value to the duration between the first and second consecutive signal transitions.

15. The semiconductor chip of claim 8, wherein the transmitter is configured to send to one of the serial receiver circuits on at least one other of the wires a second wave form having first and second consecutive signal transitions, and the serial receiver circuit is configured to receive the second wave form and measure a second duration between the first and second consecutive signal transitions using the local clock signal, the second duration being indicative of a second particular data value.

16. The semiconductor chip of claim 15, wherein the receiver is configured to combine the first particular multi-bit data value and the second particular data value into a combined data value.

17. A computing device, comprising:

a receiver having a circuit to generate a local clock signal; and a transmitter connected to the receiver by plural wires, wherein:

the computing device is configured to send from the transmitter to the receiver on at least one but not all of the wires a first wave form having first and second consecutive signal transitions;

the computing device is further configured to send from the transmitter to the receiver on at least one other of the wires a second wave form having first and second consecutive signal transitions;

the receiver is configured to receive the first wave form and measure a first duration between the first and second consecutive signal transitions using the local clock signal, wherein the first duration represents a first particular multi-bit data value; and the receiver is further configured to receive the second wave form and measure a second duration between the first and second consecutive signal transitions using the local clock signal, wherein the second duration represents a second particular data value, wherein the first particular multi-bit data value is representative of a first portion of a combined data value and the second particular data value is representative of a second portion of the combined data value, and wherein the second portion follows the first portion.

18. The computing device of claim 17, comprising a storage device operable to store non-transient computer readable instructions to enable the computing device to operate in an efficiency-based encoding mode.

19. The computing device of claim 17, comprising a semiconductor chip, the semiconductor chip including the receiver and the transmitter.

20. The computing device of claim 17, wherein the computing device is configured to combine the first particular multi-bit data value and the second particular data value into the combined data value.

* * * * *